(12) United States Patent
Yamamoto et al.

(10) Patent No.: US 8,025,956 B2
(45) Date of Patent: Sep. 27, 2011

(54) HARD FILM AND METHOD OF MANUFACTURING THE SAME

(75) Inventors: Kenji Yamamoto, Kobe (JP); German Fox-Rabinovich, Hamilton (CA)

(73) Assignee: Kabushiki Kaisha Kobe Seiko Sho (Kobe Steel, Ltd.), Kobe-shi (JP)

(*) Notice: Subject to any disclaimer, the term of this patent is extended or adjusted under 35 U.S.C. 154(b) by 323 days.

(21) Appl. No.: 11/761,762

(22) Filed: Jun. 12, 2007

(65) Prior Publication Data

US 2008/0003418 A1 Jan. 3, 2008

(30) Foreign Application Priority Data

Jun. 30, 2006 (JP) ................................ 2006-181304

(51) Int. Cl.
*B32B 9/00* (2006.01)
*C23C 14/06* (2006.01)
(52) U.S. Cl. ....... 428/216; 51/307; 51/309; 204/192.16; 428/336; 428/697; 428/698; 428/699; 428/704
(58) Field of Classification Search .................... 51/307, 51/309; 428/216, 336, 697, 698, 699, 704; 204/192.16
See application file for complete search history.

(56) References Cited

U.S. PATENT DOCUMENTS

| | | | |
|---|---|---|---|
| 6,824,601 B2* | 11/2004 | Yamamoto et al. | 428/699 |
| 6,919,288 B2* | 7/2005 | Yamamoto et al. | 51/309 |
| 7,217,466 B2* | 5/2007 | Weber et al. | 428/697 |
| 2004/0237840 A1 | 12/2004 | Yamamoto et al. | |
| 2005/0003239 A1 | 1/2005 | Derflinger et al. | |
| 2008/0318062 A1* | 12/2008 | Endrino et al. | 428/428 |

FOREIGN PATENT DOCUMENTS

| | | |
|---|---|---|
| CN | 1654701 | 8/2005 |
| DE | 019818782 A1 * | 10/1999 |
| EP | 1 431 416 A1 | 6/2004 |
| JP | 7-3432 A | 1/1995 |
| JP | 8-209337 A | 8/1996 |

(Continued)

OTHER PUBLICATIONS

Jose L. Endrino, et al., "The Influence of Alloying Elements on the Phase Stability and Mechanical Properties of AlCrN Coatings", Surface & Coatings Technology, XP 005063669, vol. 200, No. 1-4, Oct. 1, 2005, pp. 988-992.

(Continued)

*Primary Examiner* — Archene Turner
(74) *Attorney, Agent, or Firm* — Oblon, Spivak, McClelland, Maier & Neustadt, L.L.P.

(57) ABSTRACT

Disclosed are a hard film and a method useful for manufacturing the hard film wherein the hard film is obviously excellent in wear resistance, and exhibits excellent oxidation resistance even under a condition where hot heat generation tends to occur due to friction heating, consequently exhibits excellent properties compared with a usual hard-film including TiAlN, TiCrAlN, TiCrAlSiBN, CrAlSiBN, or NbCrAlSiBN. The hard film includes $(M)_a Cr_b Al_c Si_d B_e Y_f Z$ (however, M is at least one element selected from a group 4A element, a group 5A element, and a group 6A element (except for Cr) in the periodic table, and Z shows one of N, CN, NO and CNO), wherein $a+b+c+d+e+f=1$, and $0 < a \leq 0.3, 0.05 \leq b \leq 0.4, 0.4 \leq c \leq 0.8, 0 \leq d \leq 0.2, 0 \leq e \leq 0.2$, and $0.01 \leq f \leq 0.1$, (a, b, c, d, e and f show atomic ratios of M, Cr, Al, Si, B and Y respectively).

15 Claims, 1 Drawing Sheet

FOREIGN PATENT DOCUMENTS

| | | |
|---|---|---|
| JP | 2644710 | 5/1997 |
| JP | 2003-71610 | 3/2003 |
| JP | 2003-71611 | 3/2003 |
| JP | 2003-340608 A | 12/2003 |
| JP | 2004-106183 A | 4/2004 |
| JP | 2007-7764 A | 1/2007 |
| JP | 2008-505771 A | 2/2008 |
| WO | WO 2006/005217 A2 | 1/2006 |

OTHER PUBLICATIONS

Japanese Office Action mailed on Sep. 28, 2010 in corresponding Japanese Application No. 2006-181304 (with English Translation).

* cited by examiner

HARD FILM AND METHOD OF MANUFACTURING THE SAME

BACKGROUND OF THE INVENTION

1. Field of the Invention

The present invention relates to a hard film, which is formed on a surface of a cutting tool such as a tip, a drill, and an end mill, and a surface of a plastic working tool such as a forging die and a punch for improving wear resistance of the tools, and relates to a method useful for manufacturing such a hard film.

2. Description of Related Art

Usually, coating of a hard film of TiN, TiCN, TiAlN or the like has been performed for the purpose of improving wear resistance of a cutting tool using sintered hard alloy, cermet, or high speed tool steel as a base material. In particular, since a composite nitride of Ti and Al (hereinafter, abbreviated as "TiAlN") exhibits excellent wear resistance as disclosed in Japanese Patent No. 2644710, a film of the composite nitride is increasingly used for a cutting tool for cutting a very hard material (work material) such as a high speed cutting material or hardened steel in place of a film including nitride (TiN) or carbonitride (TiCN) of Ti.

However, a film further improved in wear resistance is now required with recent increase in hardness of work material or increase in cutting speed.

The hard film is further required to have oxidation resistance under high temperature. In the TiAlN film as above, oxidation resistance is comparatively high, and oxidation starts near 800 to 900° C., however, there is a difficulty that deterioration of the film tends to progress under a more severe environment. Therefore, a hard film is proposed, in which the TiAlN film is added with Cr, thereby the concentration of Al is increased while keeping a cubic crystal structure with high hardness, and consequently oxidation resistance is further improved (e.g., JP-A-2003-71610). Moreover, a hard film is proposed, in which oxidation resistance is further improved by adding Si or B into a TiCrAlN film (e.g., JP-A-2003-71611), or a hard film is proposed, in which oxidation resistance is further improved by adding Nb, Si or B into a CrAlN film (e.g., WO2006-005217) is proposed.

However, the hard films proposed so far cannot be regarded to be excellent in wear resistance and oxidation resistance, and actually, further improvement in properties is desired.

SUMMARY OF THE INVENTION

In view of foregoing, it is desirable to provide a hard film that is obviously excellent in wear resistance, and exhibits excellent oxidation resistance even under a condition that hot heat generation easily occurs due to friction heating, consequently exhibits excellent properties compared with a usual hard-film including TiAlN, TiCrAlN, TiCrAlSiBN, CrAlSiBN, or NbCrAlSiBN, and provide a method useful for manufacturing such a hard film.

A hard film of an embodiment of the invention is summarized in that it includes $(M)_a Cr_b Al_c Si_d B_e Y_f Z$ (however, M is at least one element selected from a group 4A element, a group 5A element, and a group 6A element (except for Cr) in the periodic table, and Z shows one of N, CN, NO and CNO), wherein $a+b+c+d+e+f=1$, $0 < a \leq 0.3, 0.05 \leq b \leq 0.4, 0.4 \leq c \leq 0.8, 0 \leq d \leq 0.2, 0 \leq e \leq 0.2$, and $0.01 \leq f \leq 0.1$, (a, b, c, d, e and f show atomic ratios of M, Cr, Al, Si, B and Y respectively).

Moreover, such a subject can be achieved by a hard film including $Cr_b Al_c Si_d B_e Y_f Z$ (however, Z shows one of N, CN, NO and CNO), wherein $b+c+d+e+f=1$, $0.2 \leq b \leq 0.5, 0.4 \leq c \leq 0.7, 0 \leq d \leq 0.2, 0 \leq e \leq 0.2$, and $0.01 \leq f \leq 0.1$ (however, d+e>0), (b, c, d, e and f show atomic ratios of Cr, Al, Si, B and Y respectively)

As a preferable mode of the hard film of an embodiment of the invention, a hard film is given, in which hard films as above (within a composition range shown as above) are alternately stacked with compositions being different from each other, and thickness of each layer is between 5 nm and 200 nm.

When the hard film as above is manufactured, the hard film is preferably formed by a cathode discharge arc ion plating method.

ADVANTAGE OF THE INVENTION

The hard film of an embodiment of the invention is in a hard film structure as expressed by a certain expression, thereby a hard film can be achieved, in which wear resistance is obviously excellent, and deterioration in property due to oxidation is not caused even under a condition that hot heat generation easily occurs due to friction heating. Such a hard film is extremely useful as a hard film formed on surfaces of base materials of various cutting tools, or plastic working tools such as a forging die and a punch.

DESCRIPTION OF THE PREFERRED EMBODIMENT

Figure 1:
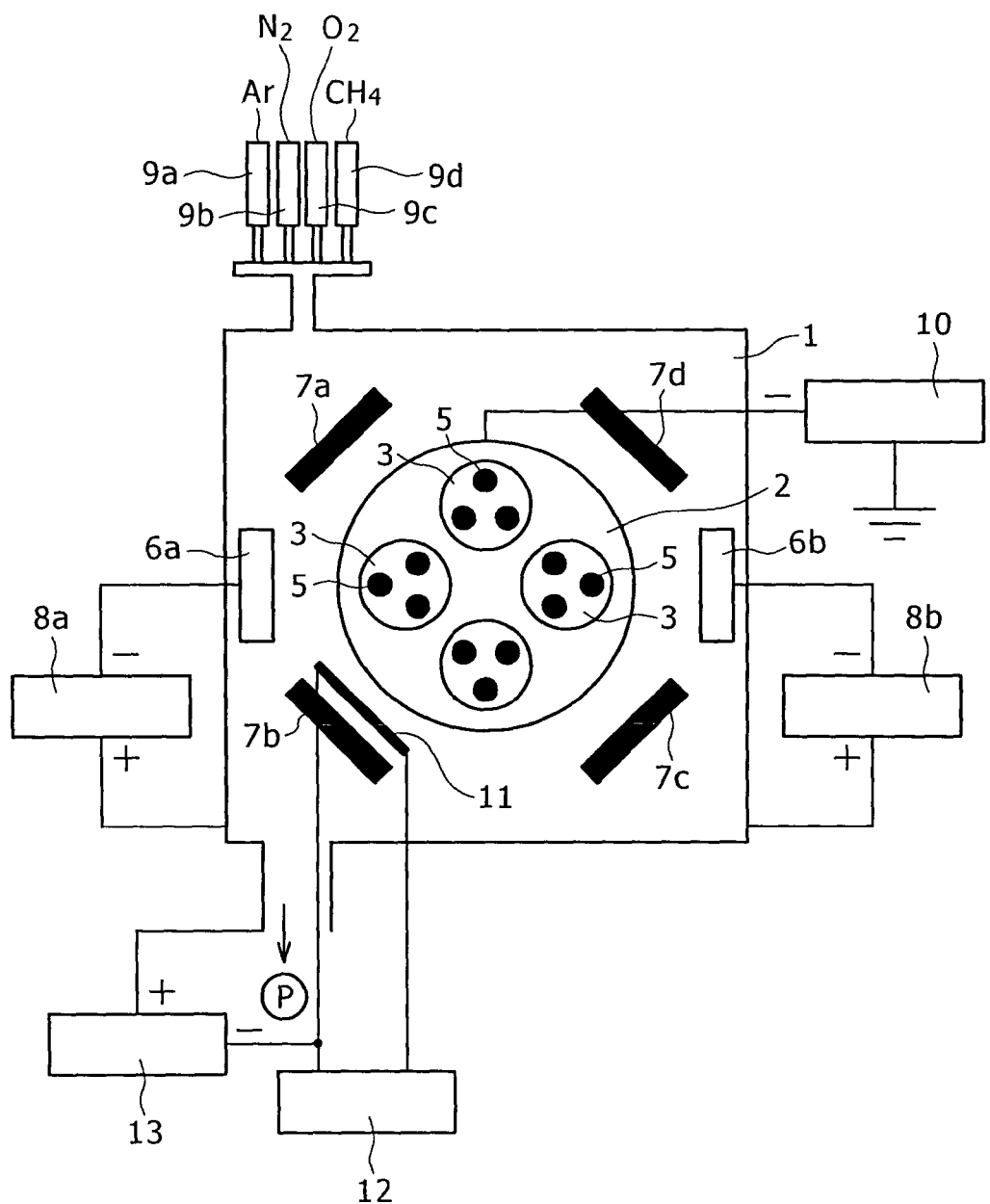
FIG. 1 is a schematic illustrative diagram showing a configuration example of an arc ion plating apparatus (AIP apparatus) for manufacturing the hard film of an embodiment of the invention.

The inventors made investigation from various points of view to further improve high-temperature resistance (oxidation resistance) of a hard film. As a result, they found that Cr was contained as an indispensable component, and Y was contained in place of Si or B being regarded to be effective for improving oxidation resistance, or contained in addition to Si or B, leading to extreme improvement in oxidation resistance of a hard film, consequently completed an embodiment of the invention. Hereinafter, a reason for selecting each element in the hard film of an embodiment of the invention, and a reason for limiting a composition range of each element are described.

The hard film of an embodiment of the invention is expressed by the following general expression (1). A reason for selecting each element in the hard film of an embodiment of the invention, and a reason for limiting a composition range of each element are described.

$$(M)_a Cr_b Al_c Si_d B_e Y_f Z \tag{1}$$

(a, b, c, d, e and f show atomic ratios of M, Cr, Al, Si, B and Y respectively, and Z shows one of N, CN, NO and CNO).

A metal element M is at least one element except for Cr selected from a group 4A element, a group 5A element, and a group 6A element (Ti, Zr, Hf, V, Nb, Ta, Mo and W) in the periodic table. The metal element exhibits an operation of forming a nitride (MN) having high hardness in a film, and thus increasing film hardness. However, since nitrides of the elements are bad in oxidation resistance compared with CrN, large content of the metal element M reduces oxidation resistance of a film. Therefore, an upper limit of an atomic ratio of M in the film needs to be 0.3 (that is, when a+b+c+d+e+f=1 is given, a needs to be 0.3 or less).

Moreover, when the metal element M is not contained at all, hardness tends to be slightly decreased, therefore a lower limit of the metal element is more than 0 (that is, a>0). A preferable range of the metal element M is 0.02 to 0.2 in the light of oxidation resistance and hardness. As the metal element M, Ti or Hf is preferably selected in the light of hardness, and Nb is preferably selected in the light of oxidation resistance and hardness.

The hard film of an embodiment of the invention contains Cr as an indispensable component. Cr is a necessary element for configuring the film to improve oxidation resistance of the film, and dissolve AlN in a CrN nitride of a cubic rocksalt type to form metastable cubic AlN. A lower limit of an atomic ratio of Cr needs to be 0.05 (that is, a subscript b is not less than 0.05) in the hard film so that Cr exhibits such effects. However, CrN is low in hardness compared with the nitrides of M, and excessive content of Cr may cause reduction in hardness of a film. Therefore, an upper limit of Cr is 0.4 (that is, b≦0.4). A preferable range of the Cr content is in a range of 0.1 to 0.25 in an atomic ratio (0.1≦b≦0.25).

Al is an element necessary for improving oxidation resistance of a hard film, and needs to be contained in an atomic ratio of 0.4 or more (that is, c≧0.4) to exhibit such an effect. However, since a stable phase of AlN primarily includes a hexagonal structure, when Al is excessively contained and significantly exceeds the total sum of added amount of metal elements M and Cr, transfer into a hexagonal structure occurs, resulting in softening of a film. Therefore, an upper limit of an atomic ratio of the content of Al needs to be 0.8 (that is, c≦0.8). A preferable range of the Al content is 0.5 to 0.6 in an atomic ratio (0.5≦c≦0.6).

Si, B and Y are added in a film with an upper limit of 0.2 (0.1 in the case of Y) in an atomic ratio to improve oxidation resistance respectively. Since Y has the largest effect of improving oxidation resistance among them, Y needs to be added in an atomic ratio of 0.01 or more (that is, f≧0.01).

Addition of Si and B provides an operation of fining crystal grains of a film and thus increasing hardness, in addition, when Si and B are contained together with Y, an effect of further improving oxidation resistance is provided. Si and B are preferably added in an atomic ratio of 0.03 or more (that is, d≧0.03, e≧0.03) to exhibit such effects respectively. However, since addition of the elements tends to cause a film to be transferred into an amorphous or hexagonal structure, upper limits of them are specified to be 0.2 in Si, 0.02 in B, and 0.1 in Y (that is, d≦0.2, e≦0.2, and f≦0.1) respectively. As a more preferable range, Si of 0.03 to 0.07, B of 0.05 to 0.1, and Y of 0.02 to 0.05 are given.

The hard film of an embodiment of the invention may include any form of a nitride, carbonitride, nitrogen oxide, and carbon-nitrogen oxide (Z is N, CN, NO or CNO in the general expression (1)). However, preferably, the form is essentially a nitride, and a ratio (atomic ratio) of N in Z is 0.5 or more. More preferably, the ratio is 0.8 or more. As an element other than N, C or O is contained as the remainder.

In an application requiring more improved oxidation resistance, a composition of the hard film contains Cr and Y as indispensable components as expressed in the following general expression (2), thereby stability can be added at further high temperature.

$$Cr_bAl_cSi_dB_eY_fZ \quad (2),$$

(b, c, d, e and f show atomic ratios of Cr, Al, Si, B and Y respectively, and Z shows one of N, CN, NO and CNO).

In such a hard film, since the metal element M being a stabilizing element of the cubic rocksalt structure is not present, a crystal structure is easily transferred into a hexagonal structure in a case of some Al content. Therefore, the content of Cr needs to be 0.2 or more (that is, b≧0.2) to stabilize a cubic AlN compound. However, when Cr is excessively contained, hardness is decreased even if a crystal structure is cubic. Therefore, an upper limit of the content of Cr needs to be 0.5 (that is, b≦0.5). A preferable range of the Cr content is about 0.3 to 0.4 in an atomic ratio (that is, 0.3≦b≦0.4).

Regarding the Al content in the hard film, since the hexagonal structure is easily formed in the hard film, an upper limit of the Al content is specified to be 0.7. More preferably, it is 0.5 to 0.6 (that is, 0.5≦c≦0.6). Regarding Si, B and Y, a specified range and a preferable range are the same as in the hard film expressed in the general expression (1). However, at least one of Si and B needs to be contained (that is, d+e>0) in the light of fining of film crystal grains and increase in hardness by adding Si or B.

The hard film of an embodiment of the invention needs not be wholly configured by a film having a single composition, but may be a hard film of a stacked type in which at least one or two layers are stacked, the layers having different compositions from one another in the composition range of the general expression (1) or (2). As an example (combination) of such a stacked-type hard film, TiCrAlSiYN/NbCrAlYN, TiCrAlBYN/HfCrAlYN and the like are given. In these examples, compositions of the films are made different from each other by changing kinds of elements configuring the respective films. However, even in a combination of the same element, compositions can be made different from each other by differing composition ranges from each other.

When the films different in composition or element are stacked as above, since lattice constants of the films are different from each other, lattice distortion is induced between layers, leading to further increase in hardness of the films. In the case that the films are stacked, thickness of each layer is preferably 5 nm or more, and when the thickness is less than 5 nm, the films exhibits the same performance as that of a film having a single structure. When thickness of each layer exceeds 200 nm, since the number of stacking is decreased because thickness of about several micrometers is required for a cutting tool or other tools, the number of interfaces in which distortion is stored is decreased, consequently the effect of increase in hardness is hardly obtained. More preferably, thickness of each layer is about 10 to 100 nm.

While a method of manufacturing the hard film of an embodiment of the invention is not particularly limited, a PVD method using a solid target is recommended for the method. In particular, the cathode discharge arc ion plating method (AIP method) is preferably used. In formation of the hard film of a multi-component system as above, if a sputtering method is used, difference in target composition is increased between a target composition and a film composition. However, such a difficulty of difference in composition is substantially eliminated in the AIP method. Moreover, there is an advantage that since an ionization ratio of a target element is high in the AIP method, a formed film is tight and high in hardness.

In the hard film of an embodiment of the invention, the hard film is provided as a stacked film in which films are stacked, the films having compositions as shown in the general expression (1) or (2) respectively, thereby film performance can be improved. However, the stacked film can be configured by combining a film having the relevant composition and a hard film having a composition other than the film composition as shown in the general expression (1) or (2). For example, the film can be configured by stacking a film including a nitride, carbide, or carbonitride of at least one element selected from a group including a group 4A element, a group 5A element, and a group 6A element in the periodic table, and Al, Si, and B, and a film having a composition as shown in the general expression (1) or (2). As such a film, a film of TiAl(CN), TiCrAl(CN), CrAl(CN), TiSi(CN), TiVAl(CN), TiNbAl (CN), NbCrAl(CN) or the like is exemplified.

FIG. 1 is a schematic illustrative diagram showing a configuration example of an arc ion plating apparatus (AIP apparatus) for manufacturing the hard film of an embodiment of the invention. In the apparatus shown in FIG. 1, a turntable 2 is disposed within a vacuum chamber 1, and four rotation tables 3 are symmetrically attached to the turntable 2. Each rotation table 3 is mounted with a body to be treated (base material) 5. Around the turntable 2, a plurality of (two in FIG. 1) arc evaporation sources 6a, 6b (cathode side), and heaters 7a, 7b, 7c and 7d are disposed. Arc voltage sources 8a, 8b are disposed at respective sides of the evaporation sources 6a, 6b to evaporate the sources respectively.

In the FIGURE, 11 is a filament-type ion source, 12 is an AC power supply for filament heating, and 13 is a DC power supply for discharge, wherein a filament (made of W) is heated by current from the AC power supply for filament heating 12, then emitted thermoelectrons are introduced into the vacuum chamber by the DC power supply for discharge 13, so that plasma (Ar) is generated between the filament and the chamber to generate Ar ions. Cleaning of the body to be treated (base material) is performed using the Ar ions. The inside of the vacuum chamber is configured in such a way that the inside is evacuated to a vacuum by a vacuum pump P, and various kinds of deposition gas is introduced through a mass flow controller 9a, 9b, 9c or 9d.

Targets having various compositions are used for the respective evaporation sources 6a, 6b. The turntable 2 and the rotation tables 3 are rotated while the targets are evaporated in a deposition gas (C-source-contained gas, $O_2$ gas, and N-source-contained gas, or diluted gas of them with inert gas) using the filament-type ion source 11, thereby hard films can be formed on a surface of the body to be treated 5. In the FIGURE, 10 is a bias voltage source provided for applying a negative voltage (bias voltage) to the base materials 5.

The hard film of the stacked type can be achieved (1) by using a plurality of different arc evaporation sources 6a, 6b, in addition, it can be achieved (2) by periodically changing a negative voltage (bias voltage) applied to the body to be treated 5, or (3) by changing an atmospheric gas. In particular, a ratio of the C-source-contained gas in the atmospheric gas is periodically changed to stack at least two kinds of films having values of carbon in the expression (1) being different from each other.

Control of a period of the hard film of the stacked type (repetition period of stacking) and thickness of each layer can be achieved by controlling rotation frequencies of the turntable and rotation tables and input power for the respective evaporation sources (proportional to the amount of evaporation) in the (1), time for applying the bias voltage in the (2), and time for introducing the atmospheric gas in the (3).

As a base material for forming the hard film of an embodiment of the invention, sintered hard alloy, cermet, cBN or the like is given as an applicable tool material, the hard film can be applied to an iron-based alloy material such as cold-worked tool steel, hot-worked tool steel, or high speed tool steel.

While the invention is described more specifically with examples hereinafter, it will be appreciated that the invention is not restricted by the following examples, and the invention can be obviously carried out with being appropriately altered or modified within a scope suitable for the content described before and after, and all of such alterations or modifications are encompassed within a technical scope of the invention.

EXAMPLES

Example 1

A target containing M, Cr, Al, Si, B and Y in various ratios was disposed on the arc evaporation source 6a of the apparatus (AIP apparatus) shown in FIG. 1, and a super-alloy tip, a super-alloy boll end mill (10 mm in diameter, two flute) as the bodies to be treated 5, and a platinum foil for an oxidation test (30 mm in length, 5 mm in width, and 0.1 mm in thickness) were mounted on the rotation tables 3, then the inside of the vacuum chamber was evacuated into a vacuum. Then, the bodies to be treated 5 were heated to a temperature of 550° C. by the heaters 7a, 7b, 7c and 7d disposed within the vacuum chamber 1, and subjected to cleaning using Ar ions (Ar, pressure of 0.6 Pa, voltage of 500 V, and time of 5 min), and then nitrogen gas ($N_2$ gas) was introduced to increase pressure in the chamber 1 to 4.0 Pa to start arc discharge, consequently hard films 3 µm in thickness were formed on surfaces of the bodies to be treated 5. When C or O was contained in the film, methane gas ($CH_4$ gas) or oxygen gas ($O_2$ gas) was introduced into the deposition apparatus in a range of flow ratio to $N_2$ gas of 5 to 50 in volume percent. During deposition, a bias voltage of 20 to 100 V was applied to a substrate such that electric potential of the bodies to be treated 5 is negative with respect to ground potential.

For obtained hard films, metal compositions in the films were measured by EPMA, and Vickers hardness (load of 0.25 N, and holding time of 15 sec) was investigated. Moreover, crystal structures of the films, and characteristics (oxidation start temperature, and wear width) of the films were evaluated.

Analysis Condition of Crystal Structure

Evaluation of the crystal structures were performed by X-ray diffraction in θ-2θ using an X-ray diffraction apparatus manufactured by Rigaku Corporation. At that time, X-ray diffraction for a cubic structure was performed using a CuKα radiation source, and peak intensity for (111) face was measured near 2θ=37.78°, peak intensity for (200) face near 2θ=43.9°, and peak intensity for (220) face near 2θ=63.8°. X-ray diffraction for a hexagonal structure was performed using the CuKα radiation source, and peak intensity for (100) face was measured near 2θ=32° to 33°, peak intensity for (102) face near 2θ=48° to 50°, and peak intensity for (110) face near 2θ=57° to 58°. A crystal structure index X was calculated using values of them according to the following expression (3), and crystal structures of the films were determined according to the following standard.

$$(IB(111)+IB(200)+IB(220))/(IB(111)+IB(200)+IB(220)+IH(100)+IH(102)+IH(110)) \quad (3),$$

wherein IB(111), IB(200) and IB(220) show peak intensity of respective faces of the cubic structure. IH(100), IH(102) and IH(110) show peak intensity of respective faces of the hexagonal structure.

A case of the index X of 0.9 or more: cubic crystal structure (in the following tables, described as B1)

A case of the index X of not less than 0.1 and less than 0.9: mixed type (in the following tables, described as B1+B4)

A case of the index X of less than 0.1: hexagonal crystal structure (in the following tables, described as B4)

Oxidation Start Temperature

A platinum sample obtained in the example (platinum foil having a hard film formed thereon) was heated from room temperature at a heating rate of 5° C./min in artificial dry air, and change in mass of the sample was investigated by a thermobalance. Oxidation start temperature was determined from an obtained mass increase curve.

Using a test end mill obtained in the example (ball end mill made of sintered hard alloy having a hard film formed on a surface thereof), cutting was performed at the following cutting conditions with SKD 11 (HRC60) as a work material, then an edge was observed by a light microscope to measure wear width of a boundary portion between a cutting face and a flank.

Cutting speed: 150 m/min
Cutter feed: 0.04 mm/cutter
Axial cutting depth: 4.5 mm
Radial cutting depth: 0.1 m/s
Cutting length: 50 m
down cut, dry cut, and air blow only Results of them are shown in the following Tables 1 and 2 together with the compositions of the hard films.

TABLE 1

| Sample No. | Hard film (atomic ratio) | | | | | | | | | | Crystal structure | Hardness (HV) | Oxidation start temperature (° C.) | Amount of wear (μm) | Remarks |
| --- | --- | --- | --- | --- | --- | --- | --- | --- | --- | --- | --- | --- | --- | --- | --- |
| | M | Cr | Al | Si | B | Y | Sum | C | N | O | | | | | |
| 1 | 0.4 (Ti) | 0 | 0.6 | 0 | 0 | 0 | 1 | 0 | 1 | 0 | B1 | 2800 | 850 | 120 | Usual example |
| 2 | 0.2 (Ti) | 0.15 | 0.65 | 0 | 0 | 0 | 1 | 0 | 1 | 0 | B1 | 3000 | 1000 | 70 | Usual example |
| 3 | 0.2 (Ti) | 0.2 | 0.55 | 0.05 | 0 | 0 | 1 | 0 | 1 | 0 | B1 | 2900 | 1100 | 50 | Usual example |
| 4 | 0 | 0.4 | 0.55 | 0.05 | 0 | 0 | 1 | 0 | 1 | 0 | B1 | 2900 | 1100 | 80 | Usual example |
| 5 | 0.45 (Ti) | 0.05 | 0.50 | 0 | 0 | 0 | 1 | 0 | 1 | 0 | B1 | 2900 | 1000 | 90 | Usual example La: 0.001 |
| 6 | 0.35 (Ti) | 0 | 0.60 | 0.05 | 0 | 0.001 | 1 | 0 | 1 | 0 | B1 | 2800 | 1100 | 80 | Effect of Y |
| 7 | 0.15 (Ti) | 0.24 | 0.60 | 0 | 0 | 0.01 | 1 | 0 | 1 | 0 | B1 | 3200 | 1100 | 45 | |
| 8 | 0.13 (Ti) | 0.24 | 0.61 | 0 | 0 | 0.02 | 1 | 0 | 1 | 0 | B1 | 3300 | 1150 | 30 | |
| 9 | 0.14 (Ti) | 0.24 | 0.57 | 0 | 0 | 0.05 | 1 | 0 | 1 | 0 | B1 | 3200 | 1200 | 30 | |
| 10 | 0.14 (Ti) | 0.24 | 0.52 | 0 | 0 | 0.10 | 1 | 0 | 1 | 0 | B1 | 3200 | 1150 | 35 | |
| 11 | 0.11 (Ti) | 0.24 | 0.50 | 0 | 0 | 0.15 | 1 | 0 | 1 | 0 | B4 | 2700 | 1100 | 60 | |
| 12 | 0.13 (Ti) | 0.22 | 0.60 | 0.03 | 0 | 0.02 | 1 | 0 | 1 | 0 | B1 | 3300 | 1250 | 25 | Effect of Si |
| 13 | 0.14 (Ti) | 0.22 | 0.55 | 0.07 | 0 | 0.02 | 1 | 0 | 1 | 0 | B1 | 3300 | 1300 | 20 | |
| 14 | 0.13 (Ti) | 0.23 | 0.50 | 0.12 | 0 | 0.02 | 1 | 0 | 1 | 0 | B1 | 3250 | 1300 | 30 | |
| 15 | 0.11 (Ti) | 0.17 | 0.50 | 0.20 | 0 | 0.02 | 1 | 0 | 1 | 0 | B1 | 3200 | 1350 | 45 | |
| 16 | 0.10 (Ti) | 0.13 | 0.50 | 0.25 | 0 | 0.02 | 1 | 0 | 1 | 0 | B4 | 2800 | 1100 | 65 | |
| 17 | 0.13 (Ti) | 0.22 | 0.61 | 0 | 0.02 | 0.02 | 1 | 0 | 1 | 0 | B1 | 3250 | 1250 | 25 | Effect of B |
| 18 | 0.13 (Ti) | 0.22 | 0.58 | 0 | 0.05 | 0.02 | 1 | 0 | 1 | 0 | B1 | 3250 | 1250 | 25 | |
| 19 | 0.13 (Ti) | 0.22 | 0.51 | 0 | 0.12 | 0.02 | 1 | 0 | 1 | 0 | B1 | 3300 | 1150 | 30 | |
| 20 | 0.13 (Ti) | 0.15 | 0.50 | 0 | 0.20 | 0.02 | 1 | 0 | 1 | 0 | B4 + B1 | 3200 | 1150 | 45 | |
| 21 | 0.10 (Ti) | 0.13 | 0.50 | 0 | 0.25 | 0.02 | 1 | 0 | 1 | 0 | B4 | 2800 | 1100 | 65 | |
| 22 | 0.13 (Ti) | 0.22 | 0.58 | 0.03 | 0.02 | 0.02 | 1 | 0 | 1 | 0 | B1 | 3350 | 1250 | 20 | Effect of Si and B |
| 23 | 0.25 (Ti) | 0.37 | 0.35 | 0 | 0 | 0.03 | 1 | 0 | 1 | 0 | B1 | 2900 | 1050 | 55 | Effect of Al |
| 24 | 0.25 (Ti) | 0.32 | 0.40 | 0 | 0 | 0.03 | 1 | 0 | 1 | 0 | B1 | 3100 | 1100 | 30 | |
| 25 | 0.20 (Ti) | 0.27 | 0.50 | 0 | 0 | 0.03 | 1 | 0 | 1 | 0 | B1 | 3200 | 1250 | 25 | |
| 26 | 0.17 (Ti) | 0.20 | 0.60 | 0 | 0 | 0.03 | 1 | 0 | 1 | 0 | B1 | 3300 | 1250 | 25 | |
| 27 | 0.12 (Ti) | 0.15 | 0.70 | 0 | 0 | 0.03 | 1 | 0 | 1 | 0 | B1 | 3150 | 1250 | 30 | |
| 28 | 0.07 (Ti) | 0.10 | 0.80 | 0 | 0 | 0.03 | 1 | 0 | 1 | 0 | B4 + B1 | 3100 | 1250 | 45 | |
| 29 | 0.05 (Ti) | 0.07 | 0.85 | 0 | 0 | 0.03 | 1 | 0 | 1 | 0 | B4 | 2800 | 1250 | 65 | |

TABLE 2

| Sample No. | Hard film (atomic ratio) | | | | | | | | | | Crystal structure | Hardness (HV) | Oxidation start temperature (° C.) | Amount of wear (μm) | Remarks |
| --- | --- | --- | --- | --- | --- | --- | --- | --- | --- | --- | --- | --- | --- | --- | --- |
| | M | Cr | Al | Si | B | Y | Sum | C | N | O | | | | | |
| 30 | 0.42 (Ti) | 0 | 0.55 | 0 | 0 | 0.03 | 1 | 0 | 1 | 0 | B1 | 2950 | 1000 | 70 | Effect of Cr |
| 31 | 0.32 (Ti) | 0.05 | 0.6 | 0 | 0 | 0.03 | 1 | 0 | 1 | 0 | B1 | 3100 | 1250 | 40 | |
| 32 | 0.27 (Ti) | 0.1 | 0.6 | 0 | 0 | 0.03 | 1 | 0 | 1 | 0 | B1 | 3200 | 1200 | 30 | |
| 33 | 0.27 (Ti) | 0.15 | 0.55 | 0 | 0 | 0.03 | 1 | 0 | 1 | 0 | B1 | 3250 | 1200 | 25 | |
| 34 | 0.17 (Ti) | 0.25 | 0.55 | 0 | 0 | 0.03 | 1 | 0 | 1 | 0 | B1 | 3200 | 1150 | 30 | |
| 35 | 0.12 (Ti) | 0.4 | 0.45 | 0 | 0 | 0.03 | 1 | 0 | 1 | 0 | B1 | 3100 | 1100 | 35 | |
| 36 | 0.07 (Ti) | 0.5 | 0.4 | 0 | 0 | 0.03 | 1 | 0 | 1 | 0 | B1 | 2900 | 1000 | 85 | |
| 37 | 0 | 0.4 | 0.57 | 0 | 0 | 0.03 | 1 | 0 | 1 | 0 | B1 | 2800 | 1200 | 80 | Effect of M(Ti) |
| 38 | 0.05 (Ti) | 0.35 | 0.57 | 0 | 0 | 0.03 | 1 | 0 | 1 | 0 | B1 | 3150 | 1250 | 40 | |
| 39 | 0.14 (Ti) | 0.25 | 0.58 | 0 | 0 | 0.03 | 1 | 0 | 1 | 0 | B1 | 3200 | 1250 | 30 | |
| 40 | 0.2 (Ti) | 0.2 | 0.57 | 0 | 0 | 0.03 | 1 | 0 | 1 | 0 | B1 | 3300 | 1200 | 25 | |
| 41 | 0.3 (Ti) | 0.12 | 0.55 | 0 | 0 | 0.03 | 1 | 0 | 1 | 0 | B1 | 3350 | 1200 | 30 | |
| 42 | 0.4 (Ti) | 0.07 | 0.5 | 0 | 0 | 0.03 | 1 | 0 | 1 | 0 | B1 | 3100 | 1000 | 67 | |
| 43 | 0.15 (Zr) | 0.25 | 0.57 | 0 | 0 | 0.03 | 1 | 0 | 1 | 0 | B1 | 3150 | 1150 | 40 | Effect of kind of M |
| 44 | 0.15 (Hf) | 0.25 | 0.57 | 0 | 0 | 0.03 | 1 | 0 | 1 | 0 | B1 | 3200 | 1200 | 30 | |
| 45 | 0.15 (V) | 0.25 | 0.57 | 0 | 0 | 0.03 | 1 | 0 | 1 | 0 | B1 | 3250 | 1100 | 35 | |
| 46 | 0.15 (Nb) | 0.25 | 0.57 | 0 | 0 | 0.03 | 1 | 0 | 1 | 0 | B1 | 3350 | 1300 | 20 | |
| 47 | 0.15 (Ta) | 0.25 | 0.57 | 0 | 0 | 0.03 | 1 | 0 | 1 | 0 | B1 | 3250 | 1200 | 30 | |
| 48 | 0.15 (Mo) | 0.25 | 0.57 | 0 | 0 | 0.03 | 1 | 0 | 1 | 0 | B1 | 3250 | 1150 | 35 | |

TABLE 2-continued

| Sample No. | Hard film (atomic ratio) | | | | | | | | | Crystal structure | Hardness (HV) | Oxidation start temperature (° C.) | Amount of wear (μm) | Remarks |
|---|---|---|---|---|---|---|---|---|---|---|---|---|---|---|
| | M | Cr | Al | Si | B | Y | Sum | C | N | O | | | | | |
| 49 | 0.15 (W) | 0.25 | 0.57 | 0 | 0 | 0.03 | 1 | 0 | 1 | 0 | B1 | 3250 | 1150 | 35 | |
| 50 | 0.15 (Ti$_{0.5}$Nb$_{0.5}$) | 0.25 | 0.57 | 0 | 0 | 0.03 | 1 | 0 | 1 | 0 | B1 | 3300 | 1250 | 25 | |
| 51 | 0.15 (Hf$_{0.5}$Zr$_{0.5}$) | 0.25 | 0.57 | 0 | 0 | 0.03 | 1 | 0 | 1 | 0 | B1 | 3250 | 1200 | 30 | |
| 52 | 0.15 (Ta$_{0.5}$Nb$_{0.5}$) | 0.25 | 0.57 | 0 | 0 | 0.03 | 1 | 0 | 1 | 0 | B1 | 3300 | 1250 | 25 | |
| 53 | 0.15 (W$_{0.5}$Hf$_{0.5}$) | 0.25 | 0.57 | 0 | 0 | 0.03 | 1 | 0 | 1 | 0 | B1 | 3200 | 1200 | 30 | |
| 54 | 0.15 (Nb) | 0.25 | 0.57 | 0 | 0 | 0.03 | 1 | 0 | 1 | 0 | B1 | 3350 | 1250 | 20 | Effect of CNO |
| 55 | 0.15 (Nb) | 0.25 | 0.57 | 0 | 0 | 0.03 | 1 | 0.1 | 0.9 | 0 | B1 | 3350 | 1200 | 20 | |
| 56 | 0.15 (Nb) | 0.25 | 0.57 | 0 | 0 | 0.03 | 1 | 0.2 | 0.8 | 0 | B1 | 3350 | 1200 | 25 | |
| 57 | 0.15 (Nb) | 0.25 | 0.57 | 0 | 0 | 0.03 | 1 | 0.3 | 0.7 | 0 | B1 | 3350 | 1150 | 45 | |
| 58 | 0.15 (Nb) | 0.25 | 0.57 | 0 | 0 | 0.03 | 1 | 0 | 0.9 | 0.1 | B1 | 3350 | 1250 | 20 | |
| 59 | 0.15 (Nb) | 0.25 | 0.57 | 0 | 0 | 0.03 | 1 | 0 | 0.8 | 0.2 | B1 | 3350 | 1250 | 25 | |
| 60 | 0.15 (Nb) | 0.25 | 0.57 | 0 | 0 | 0.03 | 1 | 0 | 0.7 | 0.3 | B1 | 3350 | 1250 | 30 | |
| 61 | 0.15 (Nb) | 0.25 | 0.57 | 0 | 0 | 0.03 | 1 | 0 | 0.6 | 0.4 | B1 | 3350 | 1250 | 45 | |

Sample Nos. 6 to 10, 12 to 15, 17 to 20, 22, 24 to 29, 31 to 35, 38 to 41, and 43 to 61 in the Tables 1 and 2 correspond to hard films satisfying requirements specified in an embodiment of the invention, and the hard films are excellent in hardness, oxidation start temperature, wear width and the like compared with usual hard films (Nos. 1 to 5) and hard films varied from the requirements specified in an embodiment of the invention (Nos. 11, 16, 21, 23, 30, 36, 37, 41 and 42).

Example 2

A target containing Cr, Al, Si, B and Y in various ratios was disposed on the arc evaporation source 6a of the apparatus (AIP apparatus) shown in FIG. 1, and a super-alloy tip, a super-alloy boll end mill (10 mm in diameter, two flute) as the bodies to be treated 5, and a platinum foil for an oxidation test (30 mm in length, 5 mm in width, and 0.1 mm in thickness) were mounted on the rotation tables 3, then the inside of the vacuum chamber was evacuated into a vacuum. Then, the bodies to be treated 5 were heated to a temperature of 550° C. by the heaters 7a, 7b, 7c and 7d disposed within the vacuum chamber 1, and subjected to cleaning using Ar ions (Ar, pressure of 0.6 Pa, voltage of 500 V, and time of 5 min), and then nitrogen gas ($N_2$ gas) was introduced to increase pressure in the chamber 1 to 4.0 Pa to start arc discharge, consequently hard films 3 μm in thickness were formed on surfaces of the bodies to be treated 5. When C or O was contained in the film, methane gas ($CH_4$ gas) or oxygen gas ($O_2$ gas) was introduced into the deposition apparatus in a range of flow ratio to $N_2$ gas of 5 to 50 in volume percent. During deposition, a bias voltage of 20 to 100 V was applied to a substrate such that electric potential of the bodies to be treated 5 is negative with respect to ground potential.

For obtained hard films, metal compositions in the films were measured by EPMA, and Vickers hardness (load of 0.25 N, and holding time of 15 sec) was investigated. Similarly as in the example 1, crystal structures of the films, and characteristics (oxidation start temperature, and wear width) of the films were evaluated.

Results of them are collectively shown in the following Table 3. It is known that hard films satisfying the requirements specified in an embodiment of the invention (sample Nos. 66 to 69, 71 to 74, 77 to 80, 85 to 87, and 89 to 91) are excellent in hardness, oxidation start temperature, wear width and the like compared with usual hard films (sample Nos. 62 to 65) and hard films varied from the requirements specified in an embodiment of the invention (sample Nos. 70, 75, 76, 81 to 84, and 88).

TABLE 3

| Sample No. | Cr | Al | Si | B | Y | Sum | C | N | O | Crystal structure | Hardness (HV) | Oxidation start temperature (° C.) | Amout of wear (μm) | Remarks |
|---|---|---|---|---|---|---|---|---|---|---|---|---|---|---|
| 62 | 0.4 | 0.6 | 0 | 0 | 0 | 1 | 0 | 1 | 0 | B1 | 2800 | 1000 | 120 | Usual example |
| 63 | 0.4 | 0.5 | 0.1 | 0 | 0 | 1 | 0 | 1 | 0 | B1 | 2900 | 1000 | 90 | Usual example |
| 64 | 0.4 | 0.5 | 0.05 | 0.05 | 0 | 1 | 0 | 1 | 0 | B1 | 2800 | 1100 | 80 | Usual example |
| 65 | 0.4 | 0.58 | 0 | 0 | 0.02 | 1 | 0 | 1 | 0 | B1 | 2900 | 1100 | 80 | Usual example |
| 66 | 0.36 | 0.6 | 0.03 | 0 | 0.01 | 1 | 0 | 1 | 0 | B1 | 3100 | 1250 | 45 | Effect of Y |
| 67 | 0.34 | 0.61 | 0.03 | 0 | 0.02 | 1 | 0 | 1 | 0 | B1 | 3150 | 1300 | 31 | |
| 68 | 0.35 | 0.57 | 0.03 | 0 | 0.05 | 1 | 0 | 1 | 0 | B1 | 3150 | 1350 | 31 | |
| 69 | 0.35 | 0.52 | 0.03 | 0 | 0.1 | 1 | 0 | 1 | 0 | B1 | 3150 | 1350 | 32 | |
| 70 | 0.32 | 0.5 | 0.03 | 0 | 0.15 | 1 | 0 | 1 | 0 | B1 | 2700 | 1100 | 60 | |
| 71 | 0.35 | 0.6 | 0.03 | 0 | 0.02 | 1 | 0 | 1 | 0 | B1 | 3300 | 1200 | 25 | Effect of Si |
| 72 | 0.36 | 0.55 | 0.07 | 0 | 0.02 | 1 | 0 | 1 | 0 | B1 | 3300 | 1250 | 23 | |
| 73 | 0.36 | 0.5 | 0.12 | 0 | 0.02 | 1 | 0 | 1 | 0 | B1 | 3250 | 1350 | 25 | |
| 74 | 0.28 | 0.5 | 0.2 | 0 | 0.02 | 1 | 0 | 1 | 0 | B1 | 3200 | 1250 | 42 | |
| 75 | 0.23 | 0.5 | 0.25 | 0 | 0.02 | 1 | 0 | 1 | 0 | B1 | 2800 | 1200 | 65 | |
| 76 | 0.58 | 0.35 | 0.04 | 0 | 0.03 | 1 | 0 | 1 | 0 | B1 | 2900 | 1050 | 55 | Effect of Al |
| 77 | 0.53 | 0.4 | 0.04 | 0 | 0.03 | 1 | 0 | 1 | 0 | B1 | 3100 | 1300 | 30 | |
| 78 | 0.43 | 0.5 | 0.04 | 0 | 0.03 | 1 | 0 | 1 | 0 | B1 | 3200 | 1300 | 25 | |
| 79 | 0.33 | 0.6 | 0.04 | 0 | 0.03 | | 0 | 1 | 0 | B1 | 3300 | 1350 | 24 | |
| 80 | 0.23 | 0.7 | 0.04 | 0 | 0.03 | 1 | 0 | 1 | 0 | B1 | 3150 | 1300 | 26 | |
| 81 | 0.13 | 0.8 | 0.04 | 0 | 0.03 | 1 | 0 | 1 | 0 | B4 | 2900 | 1250 | 70 | |
| 82 | 0.08 | 0.85 | 0.04 | 0 | 0.03 | 1 | 0 | 1 | 0 | B4 | 2800 | 1250 | 85 | |
| 83 | 0.1 | 0.85 | 0.02 | 0 | 0.03 | 1 | 0 | 1 | 0 | B4 | 2850 | 1100 | 80 | Effect of Cr |

TABLE 3-continued

| Sample No. | Cr | Al | Si | B | Y | Sum | C | N | O | Crystal structure | Hardness (HV) | Oxidation start temperature (° C.) | Amount of wear (μm) | Remarks |
|---|---|---|---|---|---|---|---|---|---|---|---|---|---|---|
| 84 | 0.2 | 0.7 | 0.05 | 0 | 0.03 | 1 | 0.1 | 0.9 | 0 | B1 | 3150 | 1300 | 45 | |
| 85 | 0.25 | 0.7 | 0.02 | 0 | 0.03 | 1 | 0.2 | 0.8 | 0 | B1 | 3200 | 1250 | 40 | |
| 86 | 0.4 | 0.55 | 0.02 | 0 | 0.03 | 1 | 0.3 | 0.7 | 0 | B1 | 3100 | 1350 | 26 | |
| 87 | 0.5 | 0.45 | 0.02 | 0 | 0.03 | 1 | 0 | 0.9 | 0.1 | B1 | 2900 | 1300 | 27 | |
| 88 | 0.6 | 0.35 | 0.02 | 0 | 0.03 | 1 | 0 | 0.6 | 0.4 | B1 | 2900 | 1100 | 75 | |
| 89 | 0.34 | 0.6 | 0.03 | 0.01 | 0.02 | 1 | 0 | 1 | 0 | B1 | 3200 | 1150 | 27 | Effect of Si |
| 90 | 0.34 | 0.6 | 0.02 | 0.02 | 0.02 | 1 | 0 | 1 | 0 | B1 | 3250 | 1200 | 25 | and B |
| 91 | 0.33 | 0.6 | 0.02 | 0.03 | 0.02 | 1 | 0 | 1 | 0 | B1 | 3150 | 1200 | 29 | |

Example 3

The plurality of arc evaporation sources 6a, 6b were installed in the apparatus (AIP apparatus) shown in FIG. 1, and stacked films including films having compositions as shown in the following Table 4 were formed. At that time, the plurality of targets 6a, 6b were simultaneously discharged, and the base materials (bodies to be treated 5) were mounted on the rotating rotation tables 3 such that the base materials alternately pass through respective fronts of the arc evaporation sources 6a, 6b, thereby the stacked films were formed. For a stacked film having a long stacking period, the arc evaporation sources 6a, 6b were alternately discharged to form the stacked film. Other film formation conditions were the same as those in the examples 1 and 2.

For obtained hard films, metal compositions in the films, Vickers hardness, crystal structures of the films, and characteristics of the films were evaluated in the same way as in the examples 1 and 2.

Results of them are collectively shown in the following Table 4. It is known that all samples (sample Nos. 92 to 102) are excellent in hardness, oxidation start temperature, wear width and the like.

TABLE 4

| | Layer A | | Layer B | | | | | Oxidation | | |
|---|---|---|---|---|---|---|---|---|---|---|
| Sample No. | Kind | Thickness (nm) | Kind | Thickness (nm) | Number of stacking | Total thickness (nm) | Crystal structure | Hardness (HV) | start temperature (° C.) | Amount of wear (μm) |
| 92 | $(Ti_{0.2}Cr_{0.2}Al_{0.57}Y_{0.03})N$ | 2 | $(Ti_{0.17}Cr_{0.2}Al_{0.5}Si_{0.1}Y_{0.03})N$ | 2 | 750 | 3000 | B1 | 3200 | 1250 | 30 |
| 93 | $(Ti_{0.2}Cr_{0.2}Al_{0.57}Y_{0.03})N$ | 5 | $(Ti_{0.17}Cr_{0.2}Al_{0.5}Si_{0.1}Y_{0.03})N$ | 5 | 300 | 3000 | B1 | 3300 | 1250 | 25 |
| 94 | $(Ti_{0.2}Cr_{0.2}Al_{0.57}Y_{0.03})N$ | 20 | $(Ti_{0.17}Cr_{0.2}Al_{0.5}Si_{0.1}Y_{0.03})N$ | 20 | 75 | 3000 | B1 | 3350 | 1250 | 20 |
| 95 | $(Ti_{0.2}Cr_{0.2}Al_{0.57}Y_{0.03})N$ | 50 | $(Ti_{0.17}Cr_{0.2}Al_{0.5}Si_{0.1}Y_{0.03})N$ | 50 | 30 | 3000 | B1 | 3350 | 1250 | 20 |
| 96 | $(Ti_{0.2}Cr_{0.2}Al_{0.57}Y_{0.03})N$ | 150 | $(Ti_{0.17}Cr_{0.2}Al_{0.5}Si_{0.1}Y_{0.03})N$ | 150 | 10 | 3000 | B1 | 3250 | 1250 | 25 |
| 97 | $(Ti_{0.2}Cr_{0.2}Al_{0.57}Y_{0.03})N$ | 200 | $(Ti_{0.17}Cr_{0.2}Al_{0.5}Si_{0.1}Y_{0.03})N$ | 200 | 7 | 2800 | B1 | 3200 | 1250 | 30 |
| 98 | $(Ti_{0.2}Cr_{0.2}Al_{0.57}Y_{0.03})N$ | 300 | $(Ti_{0.17}Cr_{0.2}Al_{0.5}Si_{0.1}Y_{0.03})N$ | 300 | 5 | 3000 | B1 | 3150 | 1250 | 35 |
| 99 | $(Ti_{0.2}Cr_{0.2}Al_{0.57}Y_{0.03})N$ | 30 | $(Nb_{0.1}Cr_{0.2}Al_{0.55}Si_{0.1}Y_{0.05})N$ | 30 | 50 | 3000 | B1 | 3250 | 1250 | 20 |
| 100 | $(Ti_{0.5}Al_{0.5})N$ | 1500 | $(Ti_{0.2}Cr_{0.2}Al_{0.57}Y_{0.03})N$ | 1500 | 1 | 3000 | B1 | 3200 | 1150 | 40 |
| 101 | $(Ti_{0.25}Cr_{0.1}Al_{0.65})N$ | 2000 | $(Ti_{0.2}Cr_{0.2}Al_{0.57}Y_{0.03})N$ | 1000 | 1 | 3000 | B1 | 3250 | 1200 | 35 |
| 102 | $(Nb_{0.15}Cr_{0.25}Al_{0.6})N$ | 20 | $(Ti_{0.17}Cr_{0.2}Al_{0.5}Si_{0.1}Y_{0.03})N$ | 20 | 75 | 3000 | B4 | 3300 | 1250 | 25 |

What is claimed is:

1. A hard film, comprising: $(M)_a Cr_b Al_c Si_d B_e Y_f Z$, wherein:
M is at least one element selected from the group consisting of a group 4A element, a group 5A element, and a group 6A element (except for Cr) in the periodic table,
Z is one of N, CN, NO and CNO,
a, b, c, d, e and f are atomic ratios of M, Cr, Al, Si, B and Y respectively, $a+b+c+d+e+f=1$, and a, b, c, d, e and f are one of following 1), 2) and 3):
1) $0 < a \leq 0.3$, $0.05 \leq b \leq 0.4$, $0.4 \leq c \leq 0.8$, $0.03 \leq d \leq 0.2$, $0 \leq e \leq 0.2$, and $0.01 \leq f \leq 0.1$,
2) $0 < a \leq 0.3$, $0.05 \leq b \leq 0.4$, $0.4 \leq c \leq 0.8$, $0 \leq d \leq 0.2$, $0.03 \leq e \leq 0.2$, and $0.01 \leq f \leq 0.1$, and
3) $0 < a \leq 0.3$, $0.05 \leq b \leq 0.4$, $0.4 \leq c \leq 0.8$, $0.03 \leq d \leq 0.2$, $0.03 \leq e \leq 0.2$, and $0.01 \leq f \leq 0.1$.

2. A hard film, comprising: $Cr_b Al_c Si_d B_e Y_f Z$, wherein:
Z is one of N, CN, NO and CNO,
b, c, d, e and f are atomic ratios of Cr, Al, Si, B and Y respectively, $b+c+d+e+f=1$, $0.2 \leq b \leq 0.5$, $0.4 \leq c \leq 0.7$, $0 \leq d \leq 0.2$, $0 \leq e \leq 0.2$, and $0.01 \leq f \leq 0.1$, and $d+e>0$.

3. A hard film, comprising the hard films according to claim 1 alternately stacked with compositions being different from each other, wherein a thickness of each layer is between 5 nm and 200 nm.

4. A hard film, comprising the hard films according to claim 2 alternately stacked with compositions being different from each other, wherein a thickness of each layer is between 5 nm and 200 nm.

5. A method of manufacturing the hard film according to claim 1, comprising forming the hard film by a cathode discharge arc ion plating method.

6. A method of manufacturing the hard film according to claim 2, comprising forming the hard film by a cathode discharge arc ion plating method.

7. The hard film according to claim 1, consisting essentially of $(M)_a Cr_b Al_c Si_d B_e Y_f Z$, wherein:
M is at least one element selected from the group consisting of a group 4A element, a group 5A element, and a group 6A element (except for Cr) in the periodic table,
Z is one of N, CN, NO and CNO, a, b, c, d, e and f are atomic ratios of M, Cr, Al, Si, B and Y respectively, $a+b+c+d+e+f=1$, and $0<a\leq0.3$, $0.05\leq b\leq0.4$, $0.4\leq c\leq0.8$, $0.03\leq d\leq0.2$, $0\leq e\leq0.2$ and $0.01\leq f\leq0.1$.

8. The hard film according to claim 1, consisting essentially of $(M)_a Cr_b Al_c Si_d B_e Y_f Z$, wherein:
   M is at least one element selected from the group consisting of a group 4A element, a group 5A element, and a group 6A element (except for Cr) in the periodic table,
   Z is one of N, CN, NO and CNO,
   a, b, c, d, e and f are atomic ratios of M, Cr, Al, Si, B and Y respectively, $a+b+c+d+e+f=1$, and $0<a\leq0.3$, $0.05\leq b\leq0.4$, $0.4\leq c\leq0.8$, $0\leq d\leq0.2$, $0.03\leq e\leq0.2$, and $0.01\leq f\leq0.1$.

9. The hard film according to claim 1, consisting essentially of $(M)_a Cr_b Al_c Si_d B_e Y_f Z$, wherein:
   M is at least one element selected from the group consisting of a group 4A element, a group 5A element, and a group 6A element (except for Cr) in the periodic table,
   Z is one of N, CN, NO and CNO,
   a, b, c, d, e and f are atomic ratios of M, Cr, Al, Si, B and Y respectively, $a+b+c+d+e+f=1$, and $0<a\leq0.3$, $0.05\leq b\leq0.4$, $0.4\leq c\leq0.8$, $0.03\leq d\leq0.2$, $0.03\leq e\leq0.2$, and $0.01\leq f\leq0.1$.

10. The hard film according to claim 2, consisting essentially of $Cr_b Al_c Si_d B_e Y_f Z$, wherein:
    Z is one of N, CN, NO and CNO,
    b, c, d, e and f are atomic ratios of Cr, Al, Si, B and Y respectively, $b+c+d+e+f=1$, $0.2\leq b\leq0.5$, $0.4\leq c\leq0.7$, $0\leq d\leq0.2$, $0\leq e\leq0.2$, and $0.01\leq f\leq0.1$, and $d+e>0.03$.

11. The hard film according to claim 1, wherein an oxidation temperature of the hard film is 1250° C. or higher and an amount of wear of the hard film is 45 μm or less.

12. The hard film according to claim 2, wherein an oxidation temperature of the hard film is 1150° C. or higher and an amount of wear of the hard film is 30 μm or less.

13. The hard film according to claim 1, wherein a>0 and M is at least one of Ti, Zr, Hf and V.

14. The hard film according to claim 1, wherein $0.02<a\leq0.2$, $0.1\leq b\leq0.25$, $0.5\leq c\leq0.6$, $0.03\leq d\leq0.07$, $0.03\leq e\leq0.1$, and $0.02\leq f\leq0.05$.

15. The hard film according to claim 1, wherein $0.3\leq b\leq0.4$, $0.5\leq c\leq0.6$, $0.03\leq d\leq0.07$, $0.03\leq e\leq0.1$, and $0.02\leq f\leq0.05$.

* * * * *